(12) United States Patent
Chung et al.

(10) Patent No.: US 11,488,937 B2
(45) Date of Patent: Nov. 1, 2022

(54) SEMICONDUCTOR PACKAGE WITH STACK STRUCTURE AND METHOD OF MANUFACTURING THE SEMICONDUCTOR PACKAGE

(71) Applicant: SAMSUNG ELECTRONICS CO., LTD., Suwon-si (KR)

(72) Inventors: Hyunsoo Chung, Hwaseong-si (KR); Myungkee Chung, Hwaseong-si (KR); Younglyong Kim, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 17/218,340

(22) Filed: Mar. 31, 2021

(65) Prior Publication Data
US 2022/0068887 A1    Mar. 3, 2022

(30) Foreign Application Priority Data

Sep. 2, 2020    (KR) .......................... 10-2020-0111673

(51) Int. Cl.
| | | |
|---|---|---|
| H01L 25/065 | (2006.01) |
| H01L 23/538 | (2006.01) |
| H01L 23/31 | (2006.01) |
| H01L 23/12 | (2006.01) |

(52) U.S. Cl.
CPC .......... *H01L 25/0657* (2013.01); *H01L 23/12* (2013.01); *H01L 23/31* (2013.01); *H01L 23/5386* (2013.01)

(58) Field of Classification Search
CPC .................................................. H01L 25/0657
USPC ........................................................ 257/777
See application file for complete search history.

(56) References Cited

U.S. PATENT DOCUMENTS

| | | |
|---|---|---|
| 7,545,048 B2 | 6/2009 | Meyer et al. |
| 8,138,613 B2 | 3/2012 | Kweon et al. |
| 8,866,284 B2 | 10/2014 | Kobayashi et al. |
| 8,936,966 B2 | 1/2015 | Hung et al. |
| 9,000,584 B2 | 4/2015 | Lin et al. |
| 9,508,674 B2 | 11/2016 | Pan et al. |
| 10,304,808 B2 | 5/2019 | Ye et al. |
| 10,373,940 B2 | 8/2019 | Lee |
| 2015/0137389 A1 | 5/2015 | Du |
| 2018/0145104 A1 | 5/2018 | Kim et al. |

(Continued)

*Primary Examiner* — Ajay Arora
(74) *Attorney, Agent, or Firm* — Lee IP Law, P.C.

(57) ABSTRACT

A semiconductor package includes a package substrate, a lower package structure on the package substrate that includes a mold substrate, a semiconductor chip in the mold substrate having chip pads exposed through the mold substrate, spacer chips in the mold substrate and spaced apart from the semiconductor chip, and a redistribution wiring layer on the mold substrate that has redistribution wirings electrically connected to the chip pads, first and second stack structures on the lower package structure spaced apart from each other, each of the first and second stack structures including stacked memory chips, and a molding member covering the lower package structure and the first and second stack structures, wherein the mold substrate includes a first covering portion covering side surfaces of the semiconductor chip and the spacer chips, and a second covering portion covering a lower surface of the semiconductor chip.

20 Claims, 16 Drawing Sheets

(56) References Cited

U.S. PATENT DOCUMENTS

2021/0066245 A1\* 3/2021 Ahn .................... H01L 25/0652
2022/0020728 A1\* 1/2022 Park ....................... H01L 24/32

\* cited by examiner

SEMICONDUCTOR PACKAGE WITH STACK STRUCTURE AND METHOD OF MANUFACTURING THE SEMICONDUCTOR PACKAGE

CROSS-REFERENCE TO RELATED APPLICATION

Korean Patent Application No. 10-2020-0111673, filed on Sep. 2, 2020, in the Korean Intellectual Property Office, and entitled: "Semiconductor Package and Method of Manufacturing the Semiconductor Package," is incorporated by reference herein in its entirety.

BACKGROUND

1. Field

Example embodiments relate to a semiconductor package and a method of manufacturing the semiconductor package. More particularly, example embodiments relate to a multi-chip package including a plurality of stacked chips and a method of manufacturing the same.

2. Description of the Related Art

Mobile devices, e.g., smartphones and tablet personal computers (PCs), may store information using internal memory. A universal flash storage (UFS) package may be used as the internal memory.

SUMMARY

According to example embodiments, a semiconductor package includes a package substrate, a lower package structure arranged on the package substrate and including a mold substrate, a semiconductor chip provided in the mold substrate such that chip pads of the semiconductor chip are exposed from the mold substrate, a plurality of spacer chips provided in the mold substrate to be spaced apart from the semiconductor chip, and a redistribution wiring layer arranged on the mold substrate and having redistribution wirings electrically connected to the chip pads, first and second stack structures on the lower package structure to be spaced apart from each other, each of the first and second stack structures including a plurality of stacked memory chips, and a molding member on the package substrate to cover the lower package structure and the first and second stack structures. The mold substrate includes a first covering portion covering side surfaces of the semiconductor chip and the spacer chips and a second covering portion covering a lower surface of the semiconductor chip.

According to example embodiments, a semiconductor package includes a package substrate, a lower package structure adhered onto the package substrate by a first adhesive member, first and second stack structures on the lower package structure to be spaced apart from each other, each of the first and second stack structures including a plurality of stacked memory chips, and a molding member on the package substrate to cover the lower package structure and the first and second stack structures. The lower package structure includes a mold substrate, a semiconductor chip provided in the mold substrate such that chip pads of the semiconductor chip are exposed from the mold substrate, a plurality of spacer chips provided in the mold substrate to be spaced apart from the semiconductor chip, and a redistribution wiring layer arranged on the mold substrate and having redistribution wirings electrically connected to the chip pads. A thickness of the semiconductor chip is within a range of 40 μm to 60 μm, and a thickness of the first adhesive member is within a range of 15 μm to 25 μm.

According to example embodiments, a semiconductor package includes a package substrate, a lower package structure arranged on the package substrate and including a mold substrate, a semiconductor chip provided in the mold substrate such that chip pads of the semiconductor chip are exposed from the mold substrate, a plurality of spacer chips provided in the mold substrate to be spaced apart from the semiconductor chip, and a redistribution wiring layer arranged on the mold substrate and having redistribution wiring pads electrically connected to the chip pads, first and second stack structures on the lower package structure to be spaced apart from each other, each of the first and second stack structures including a plurality of stacked memory chips, first conductive connection members electrically connecting the redistribution wiring pads and substrate pads of the package substrate, second conductive connection members electrically connecting chip pads of the memory chips and substrate pads of the package substrate, and a molding member on the package substrate to cover the lower package structure and the first and second stack structures. The mold substrate includes a first covering portion covering side surfaces of the semiconductor chip and the spacer chips and a second covering portion covering a lower surface of the semiconductor chip.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
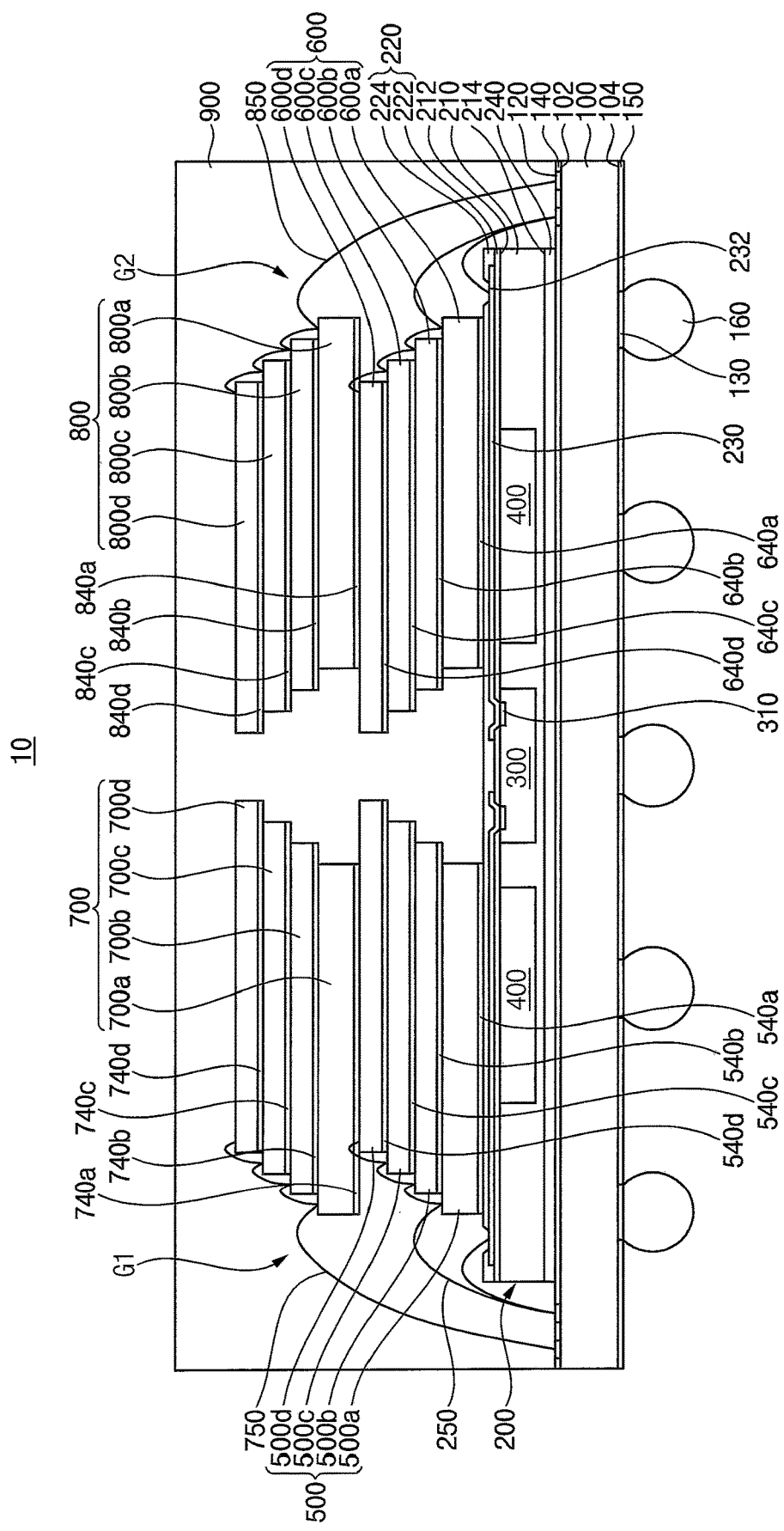
FIG. 1 is a cross-sectional view illustrating a semiconductor package in accordance with example embodiments.
Figure 2:
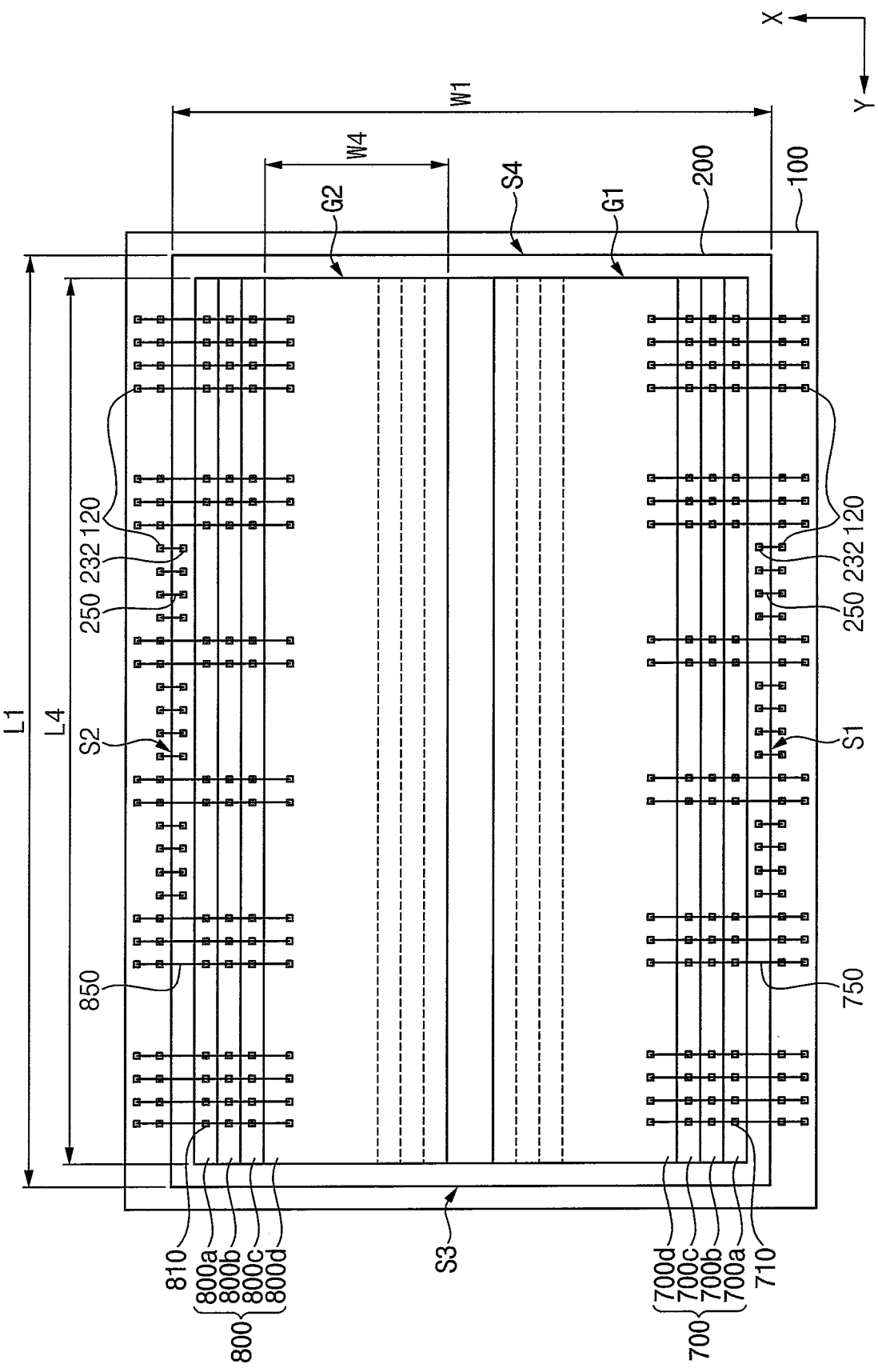
FIG. 2 is a plan view illustrating the semiconductor package in FIG. 1.
Figure 3:
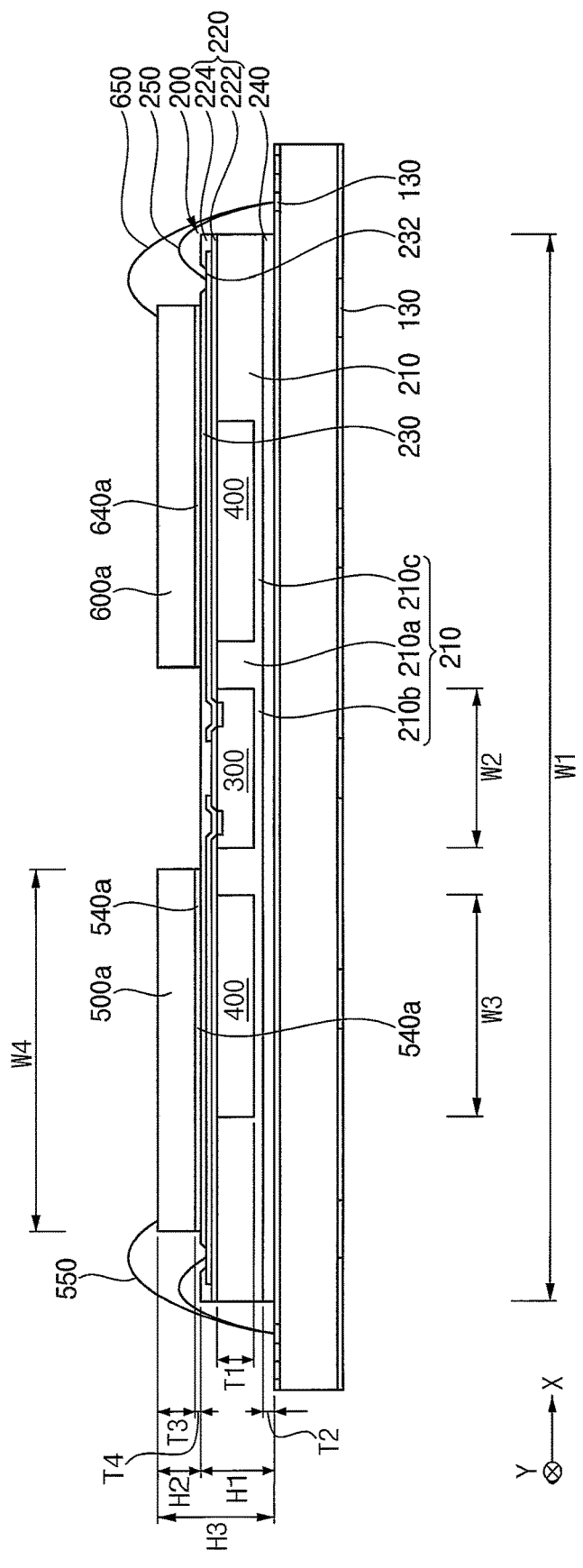
FIG. 3 is a cross-sectional view illustrating lowermost first and second memory chips stacked on a lower package structure in FIG. 1.
Figure 4:
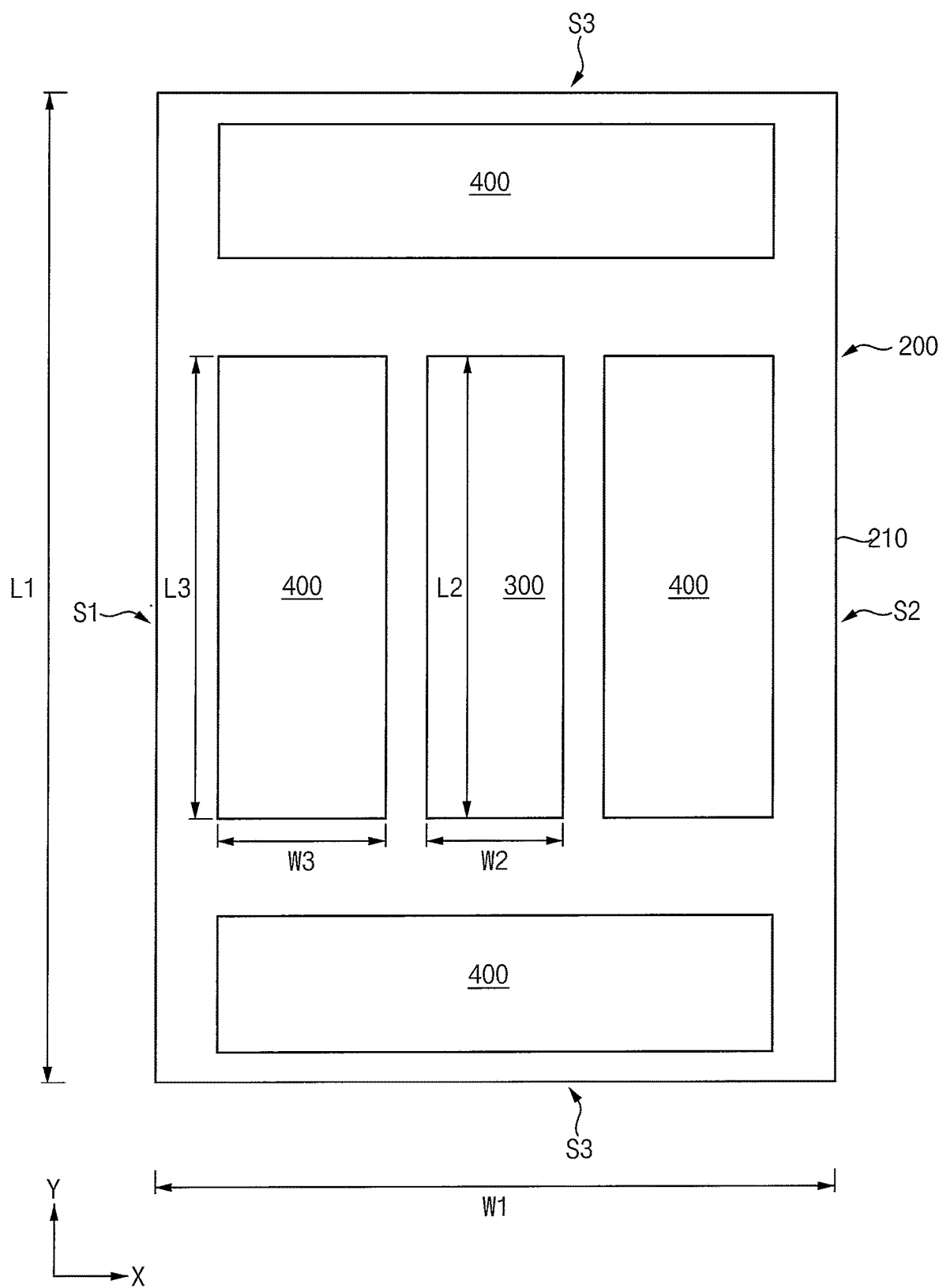
FIG. 4 is a plan view illustrating a semiconductor chip and spacer chips in the lower package structure in FIG. 1.

FIG. 1 is a cross-sectional view illustrating a semiconductor package in accordance with example embodiments. FIG. 2 is a plan view illustrating the semiconductor package in FIG. 1. FIG. 3 is a cross-sectional view illustrating lowermost first and second memory chips stacked on a lower package structure in FIG. 1. FIG. 4 is a plan view illustrating a semiconductor chip and spacer chips in the lower package structure in FIG. 1.

Referring to FIGS. 1 to 4, a semiconductor package 10 may include a package substrate 100, a lower package structure 200 having a semiconductor chip 300 and spacer chips 400 molded therein, first and second stack structures G1 and G2, each including a plurality of memory chips, and a molding member 900. Additionally, the semiconductor package 10 may further include outer connection members 160.

In example embodiments, the semiconductor package 10 may be a multi-chip package (MCP) including different kinds of semiconductor chips. The semiconductor package 10 may be a System In Package (SIP) including a plurality of semiconductor chips stacked or arranged in one package to perform all or most of the functions of an electronic system. For example, the semiconductor package 10 may be a universal flash storage (UFS) device including a controller and a plurality of stacked memory chips.

The package substrate 100 may be a substrate having an upper surface 102 and a lower surface 104 opposite to each other. For example, the package substrate 100 may include a printed circuit board (PCB), a flexible substrate, a tape substrate, etc. The package substrate 100 may include a multi circuit board having vias and various circuit elements therein. The package substrate 100 may include wirings therein as channels for electrical connection between the semiconductor chip 300 and the memory chips.

Substrate pads 120 may be arranged on the upper surface 102 of the package substrate 100. The substrate pads 120 may be connected to the wirings, respectively. The wirings may extend on the upper surface 102 of the package substrate 100 or inside the package substrate 100. For example, at least a portion of the wirings may be used as the substrate pad, i.e., a landing pad.

Although some substrate pads 120 are illustrated, the number and locations of the substrate pads are exemplarily illustrated, and thus, it may not be limited thereto. Since the wirings as well as the substrate pads are well known in the art, illustration and description concerning the above elements will be omitted.

A first insulation film 140 may be formed on the upper surface 102 of the package substrate 100 to expose the substrate pads 120. The first insulation film 140 may cover the entire upper surface 102 of the package substrate 100 except the substrate pads 120. For example, the first insulation film 140 may include solder resist.

In example embodiments, the lower package structure 200 may be mounted on the package substrate 100. The lower package structure 200 may be adhered onto the upper surface 102 of the package substrate 100 by a first adhesive member 240, e.g., the first adhesive member 240 may be between a bottom of the lower package structure 200 and a top of the first insulation film 140. For example, the first adhesive member 240 may include an adhesive film, e.g., a direct adhesive film (DAF).

The lower package structure 200 may include a mold substrate 210, the semiconductor chip 300 provided in the mold substrate 210 such that the chip pads 310 are exposed from the mold substrate 210, a plurality of the spacer chips 400 provided in the mold substrate 210 to be spaced apart from the semiconductor chip 300, and a redistribution wiring layer 220 formed on a first surface 212 of the mold substrate 210 and having redistribution wirings 230 electrically connected to the chip pads 310. The redistribution wiring 230 may include a redistribution wiring pad 232 arranged in a peripheral region of the mold substrate 210.

The lower package structure 200 as a sub semiconductor package may be a fan out package where the redistribution wiring layer 220 is formed to extend to the mold substrate 210 in a region outside the semiconductor chip 300. The redistribution wiring layer 220 may be formed by a wafer-level (or panel-level) redistribution wiring process.

In particular, the mold substrate 210 may have the first surface 212 and a second surface 214 opposite to each other. The mold substrate 210 may include, e.g., an epoxy molding compound. The semiconductor chip 300 and the plurality of the spacer chips 400 may be received, e.g., embedded, in the mold substrate 210.

The semiconductor chip 300 may include a plurality of the chip pads 310 on a first surface (e.g., active surface) thereof. The semiconductor chip 300 may be disposed in the mold substrate 210 such that the first surface on which the chip pads 310 are formed faces toward the first surface of the lower package structure 200, e.g., the first surface on which the chip pads 310 are formed may face away from the package substrate 100.

The first surface (upper surface) of the semiconductor chip 300 may be exposed by the first surface 212 of the mold substrate 210. Accordingly, the chip pads 310 of the semiconductor chip 300 may be exposed from the first surface 212 of the mold substrate 210. The first surface of the semiconductor chip 300 may be exposed by the mold substrate 210, and a second surface opposite to the first surface of the semiconductor chip 300 and side surfaces thereof may be covered by the mold substrate 210. Similarly, surfaces other than one surface, e.g., upper surface, of the spacer chip 400 may be covered by the mold substrate 210. Additionally, the mold substrate 210 may fill spaces between the semiconductor chip 300 and the spacer chips 400.

The mold substrate 210 may include a first covering portion 210a covering the side surfaces of the semiconductor chip 300 and the spacer chips 400, a second covering portion 210b covering the second surface (lower surface) of the semiconductor chip 300 and a third covering portion 210c covering a lower surface of the spacer chip 400. For example, as illustrated in FIG. 3, the first through third covering portions 210a through 210c may be integral with each other, e.g., formed of a same material in a same process to define a seamless structure surrounding the semiconductor chip 300 and the spacer chips 400. The first adhesive member 240 may be interposed between the second surface 214 of the mold substrate 210 of the lower package structure 200 and the package substrate 100, e.g., the first adhesive member 240 may be interposed between a top of the package substrate 100 and bottoms of the second and third covering portions 210b and 210c of the mold substrate 210.

Accordingly, because the lower surface of the semiconductor chip 300 and the lower surfaces of the spacer chips 400 are covered by the second and third covering portions 210b and 210c of the mold substrate 210, an adhesive strength of the first adhesive member 240 with the mold substrate 210 may be increased. Further, the second covering portion 210b of the mold substrate 210 may protect the semiconductor chip 300 from external impacts and may prevent ionic impurities from penetrating through the first adhesive member 240.

The semiconductor chip 300 may include integrated circuits. For example, the semiconductor chip 300 may be a logic chip including logic circuits. The logic chip may be a controller for controlling memory chips. The semiconductor chip 300 may be a processor chip such as an application-specific integrated circuit (ASIC) for host, e.g., central processing unit (CPU), graphic processing unit (GPU), system on chip (SoC), etc.

The spacer chip 400 may include a dummy semiconductor chip including silicon. For example, the dummy semiconductor chip of the spacer chip 400 may have a structure, e.g., thickness, similar to that of semiconductor chip 300, but may not be practically, e.g., electrically, functioning within the semiconductor package 10. Thus, an electrical signal is not applied to the dummy semiconductor chip, and the dummy semiconductor chip does not perform an electrically specific function.

The redistribution wiring layer 220 may be formed on the first surface 212 of the mold substrate 210. The redistribution wiring layer 220 may include a first insulation layer 222 provided on the first surface 212 of the mold substrate 210 and having first openings that expose the chip pads 310, respectively, the redistribution wirings 230 provided on the first insulation layer 222 and at least portions of which make contact with the chip pads 310 through the first openings, respectively, and a second insulation layer 224 provided on the first insulation layer 222 to cover the redistribution wirings 230 and having second openings that expose portions of the redistribution wirings 230, i.e., exposing redistribution wiring pad regions, respectively.

For example, the first and second insulation layers 222 and 224 may include a polymer layer, a dielectric layer, etc. The first and second insulation layers 22 and 224 may include a photosensitive insulating layer. The redistribution wirings 230 may include, e.g., aluminum (Al), copper (Cu), tin (Sn), nickel (Ni), gold (Au), platinum (Pt) or an alloy thereof.

The redistribution wiring 230 may extend from the chip pad 310 of the semiconductor chip 300 to the peripheral region. The portion of the redistribution wiring 230 exposed by the second opening of the second insulation layer 224 may be used as the redistribution wiring pad 232. The redistribution wiring pad 232 may be located in the peripheral region that does not overlap with the memory chips stacked on the lower package structure 200. Accordingly, the lower package structure 200 may include the redistribution wiring layer 220 having fan-out types of redistribution wiring pads 232.

The semiconductor chip 300 may be electrically connected to the package substrate 100 by first conductive connection members 250. In particular, the first conductive connection member 250 may electrically connect the redistribution wiring pad 232 of the lower package structure 200 to the substrate pad 120 of the package substrate 100. For example, the first conductive connection member 250 may include a bonding wire.

Accordingly, the lower package structure 200 may be stacked on the package substrate 100 by the first adhesive member 240, and the semiconductor chip 300 molded in the lower package structure 200 may be electrically connected to the package substrate 100 by a plurality of the first conductive connection members 250. Additionally, the plurality of the spacer chips 400 may be arranged symmetrically at both, e.g., opposite, sides of the semiconductor chip 300 to thereby reduce or prevent warpage of the lower package structure 200.

In example embodiments, the first stack structure G1 may be stacked on the lower package structure 200 on the package substrate 100. The first stack structure G1 may include a plurality of memory chips sequentially stacked on the lower package structure 200. For example, the plurality of memory chips may include memory chips 500 and 700 having memory devices, e.g., dynamic random-access memory (DRAM), NAND flash memory, etc.

The first stack structure G1 may include first memory chips 500a, 500b, 500c, 500d and third memory chips 700a, 700b, 700c, 700d. The first memory chips 500a, 500b, 500c, 500d may be sequentially adhered on the lower package structure 200 using second adhesive members 540a, 540b, 540c, 540d, respectively. The third memory chips 700a, 700b, 700c, 700d may be sequentially adhered on the first memory chips 500 using second adhesive members 740a, 740b, 740c, 740d, respectively. For example, the second adhesive member may include an adhesive film, e.g., a direct adhesive film (DAF).

The first memory chips 500a, 500b, 500c, 500d may be electrically connected to the package substrate 100 by second conductive connection members 550. In particular, the second conductive connection member 550 may electrically connect a chip pad of the first memory chip 500 to the substrate pad 120 of the package substrate 100. For example, the second conductive connection member 550 may include a bonding wire. Accordingly, the first memory chip 500 may be electrically connected to the package substrate 100 by a plurality of the second conductive connection members 550.

The third memory chips 700a, 700b, 700c, 700d may be electrically connected to the package substrate 100 by second conductive connection members 750. In particular, the second conductive connection member 750 may electrically connect a chip pad 710 of the third memory chip 700 to the substrate pad 120 of the package substrate 100. For example, the second conductive connection member 750 may include a bonding wire. Accordingly, the third memory chip 700 may be electrically connected to the package substrate 100 by a plurality of the second conductive connection members 750.

In example embodiments, the second stack structure G2 may be stacked on the lower package structure 200 on the package substrate 100. The second stack structure G2 may be arranged on the lower package structure 200 to be spaced apart from the first stack structure G1, e.g., in a horizontal direction. The first and second stack structures G1 and G2 may be arranged side by side on the lower package structure 200. The second stack structure G2 may include a plurality of memory chips 600 and 800 sequentially stacked on the lower package structure 200. For example, the memory chips 600 and 800 may include memory devices, e.g., DRAM, NAND flash memory, etc.

The second stack structure G2 may include second memory chips 600a, 600b, 600c, 600d and fourth memory chips 800a, 800b, 800c, 800d. The second memory chips 600a, 600b, 600c, 600d may be sequentially adhered on the lower package structure 200 using second adhesive members 640a, 640b, 640c, 640d, respectively. The fourth memory chips 800a, 800b, 800c, 800d may be sequentially adhered on the second memory chips 600 using second adhesive members 840a, 840b, 840c, 840d, respectively.

The second memory chips 600a, 600b, 600c, 600d may be electrically connected to the package substrate 100 by second conductive connection members 650. In particular, the second conductive connection member 650 may electrically connect a chip pad of the second memory chip 600 to the substrate pad 120 of the package substrate 100. For example, the second conductive connection member 650 may include a bonding wire. Accordingly, the second memory chip 600 may be electrically connected to the package substrate 100 by a plurality of the second conductive connection members 650.

The fourth memory chips 800a, 800b, 800c, 800d may be electrically connected to the package substrate 100 by second conductive connection members 850, respectively. In particular, the second conductive connection member 850 may electrically connect a chip pad 810 of the fourth memory chip 800 to the substrate pad 120 of the package substrate 100. For example, the second conductive connection member 850 may include a bonding wire. Accordingly, the fourth memory chip 800 may be electrically connected to the package substrate 100 by a plurality of the second conductive connection members 850.

In example embodiments, the first memory chips 500*a*, 500*b*, 500*c*, 500*d* may be stacked in a cascade structure, e.g., horizontally offset from each other to define e a step structure. The second memory chips 600*a*, 600*b*, 600*c*, 600*d* may be stacked in a cascade structure, e.g., horizontally offset from each other to define e a step structure. The first memory chips 500*a*, 500*b*, 500*c*, 500*d* may be sequentially offset-aligned in a direction toward the second stack structure G2 on the lower package structure 200. The second memory chips 600*a*, 600*b*, 600*c*, 600*d* may be sequentially offset-aligned in a direction toward the first stack structure G1 on the lower package structure 200.

The third memory chips 700*a*, 700*b*, 700*c*, 700*d* may be stacked in a cascade structure, e.g., horizontally offset from each other to define e a step structure. The fourth memory chips 800*a*, 800*b*, 800*c*, 800*d* may be stacked in a cascade structure, e.g., horizontally offset from each other to define e a step structure. The third memory chips 700*a*, 700*b*, 700*c*, 700*d* may be sequentially offset-aligned in a direction toward the second stack structure G2 on the lower package structure 200. The fourth memory chips 800*a*, 800*b*, 800*c*, 800*d* may be sequentially offset-aligned in a direction toward the first stack structure G1 on the lower package structure 200.

Additionally, the number of the memory chips of the first stack structure G1 may be the same as the number of the memory chips of the second stack structure G2. For example, as illustrated in FIG. 1, the first stack structure G1 and the second stack structure G2 may be arranged symmetrically with respect to a vertical axis through the semiconductor chip 300.

As illustrated in FIGS. 2 to 4, the semiconductor chip 300 and the plurality of the spacer chips 400 may be arranged in the mold substrate 210 to be spaced apart from each other, e.g., the semiconductor chip 300 may be between and horizontally spaced apart from two spacer chips 400 along the X direction and along the Y direction (FIG. 4). The spacer chips 400 may be arranged symmetrically on both sides of the semiconductor chip 300. The first and second stack structures G1 and G2 may be arranged on the lower package structure 200 to be spaced apart from each other.

As illustrated in FIG. 4, the lower package structure 200 may include a first side surface S1 and a second side surface S2 opposite to each other and extending in a direction parallel with a first direction (e.g., the Y direction), which is parallel to the first surface 212. The lower package structure 200 may further include a third side surface S3 and a fourth side surface S4 opposite to each other and extending in parallel with a second direction (e.g., the X direction) which is perpendicular to the first direction.

A length in the first direction (Y direction) of the mold substrate 210 may be the same as a length in the first direction (Y direction) of the redistribution wiring layer 220, and may define a longitudinal direction length L1 of the lower package structure 200. A length in the second direction (X direction) of the mold substrate 210 may be the same as a length in the second direction (X direction) of the redistribution wiring layer 220, and may define a transverse direction length W1 of the lower package structure 200.

The transverse direction length, i.e., the width W1 in the X direction, of the lower package structure 200 may be within a range of about 8 mm to about 12 mm. A width W2 of the semiconductor chip 300 in the X direction may be within a range of about 2 mm to about 5 mm, a width W3 of the spacer chip 400 in the X direction may be within a range of about 1.5 mm to about 5 mm, and a width W4 of the memory chip 500*a* in the X direction (FIG. 2) may be within a range of about 3 mm to about 5 mm. In this embodiment, the width W1 of the lower package structure 200 may be about 9 mm, and the width W4 of the memory chip 500*a* may be about 3.8 mm.

A ratio W4/W1 of the width W4 of the memory chip 500*a* and the width W1 of the lower package structure 200 may be within a range of about 0.25 to about 0.625. In this embodiment, the ratio W4/W1 of the width W4 of the memory chip 500*a* and the width W1 of the lower package structure 200 may be less than about 0.5.

As further illustrated in FIG. 4, the longitudinal direction length, i.e., a length L1 in the Y direction, of the lower package structure 200 may be within a range of about 11 mm to about 14 mm, a length L2 of the semiconductor chip 300 in the Y direction may be within a range of about 4 mm to about 6 mm, a length L3 of the spacer chip 400 in the Y direction may be within a range of about 3 mm to about 8 mm, and a length L4 of the memory chip 500*a* in the Y direction (FIG. 2) may be within a range of about 10 mm to about 13 mm. In this embodiment, the length L1 of the lower package structure 200 may the same as the length L4 of the memory chip 500*a*. The length L1 of the lower package structure 200 may be about 12.7 mm.

A first thickness T1 of the semiconductor chip 300 may be within a range of about 40 μm to about 60 and a second thickness T2 of the first adhesive member 240 may be within a range of about 15 μm to about 25 μm, e.g., a first height H1 of the lower package structure 200 may be larger than the sum of the first thickness T1 and the second thickness T2 (i.e., H1>T1+T2). For example, the first thickness T1 of the semiconductor chip 300 may be about 50 and the second thickness T2 of the first adhesive member 240 may be about 20 μm.

A third thickness T3 of the lowermost first memory chip 500*a* may be within a range of about 35 μm to about 55 and a fourth thickness T4 of the second adhesive member 540 may be within a range of about 3 μm to about 10 μm, e.g., a second height H2 of the lowermost first memory chip 500*a* may equal the sum of the third thickness T3 and the fourth thickness T4 (i.e., H2=T3+T4). For example, the third thickness T3 of the lowermost first memory chip 500*a* may be about 45 and the fourth thickness T4 of the second adhesive member 540*a* may be about 5 μm.

A third height H3, i.e., a vertical distance, of the top of the lowermost first memory chip 500*a* from the upper surface of the package substrate 100, e.g., from the top of the first insulation film 140, may be within a range of about 110 μm to about 130 μm. For example, as illustrated in FIG. 3, the third height H3 may be a total height of the lower package structure 200 and the lowermost first memory chip 500*a* (i.e., H3=H1+H2). For example, the third height H3 of the top of the lowermost first memory chip 500*a* from the upper surface of the package substrate 100 may be about 120 Thus, the semiconductor chip 300 and the spacer chips 400 may be molded in a fan-out package shape, e.g., within the lower package structure 200, to thereby reduce the overall thickness of the entire package.

In this embodiment, four spacer chips 400 may be arranged. However, the number, thickness, area, arrangements, etc. of the spacer chips 400 may be determined in order to prevent warpage of the lower package structure 200 including the semiconductor chip 300 and the spacer chips 400.

In example embodiments, the molding member 900 may be formed on the package substrate 100 to cover the lower package structure 200, the first stack structure G1, and the second stack structure G2. The molding member 900 may include, e.g., epoxy molding compound (EMC).

Outer connection pads 130 for supplying an electrical signal may be formed on the lower surface 104 of the package substrate 100. The outer connection pads 130 may be exposed by a second insulation film 150. The second insulation film 150 may include, e.g., a silicon oxide layer, a silicon nitride or a silicon oxynitride layer. The outer connection member 160 for electrical connection with an external device may be disposed on the outer connection pad 130. For example, the outer connection member 160 may include a solder ball. The semiconductor package 10 may be mounted on a module substrate via the solder balls to form a memory module.

As mentioned above, the semiconductor package 10 may include the lower package structure 200 as a fan-out package including the semiconductor chip 300 and the plurality of the spacer chips 400 within the mold substrate 210, and the first and second stack structures G1 and G2 arranged on the lower package structure 200 to be spaced apart from each other, and each including a plurality of the memory chips 500, 600, 700, 800. The upper surface of the semiconductor chip 300 and the upper surfaces of the spacer chips 400 may be exposed within the mold substrate 210, to thereby decrease the entire thickness of the package. The spacer chips 400 may be molded in the lower package structure 200 to be arranged symmetrically on both sides of the semiconductor chip 300 to thereby reduce or prevent warpage of the lower package structure 200.

Additionally, because the lower surface of the semiconductor chip 300 and the lower surfaces of the spacer chips 400 are covered by the second and third covering portions 210b and 210c of the mold substrate 210, an adhesive strength of the first adhesive member 240 with the mold substrate 210 may be increased. Further, the second covering portion 210b of the mold substrate 210 may protect the semiconductor chip 300 from external impacts and may prevent ionic impurities from penetrating through the first adhesive member 240.

Hereinafter, a method of manufacturing the semiconductor package 10 in FIG. 1 will be explained with reference to FIGS. 5 to 15. FIGS. 5 to 15 are cross-sectional views illustrating stages in a method of manufacturing a semiconductor package in accordance with example embodiments.

Figure 5:
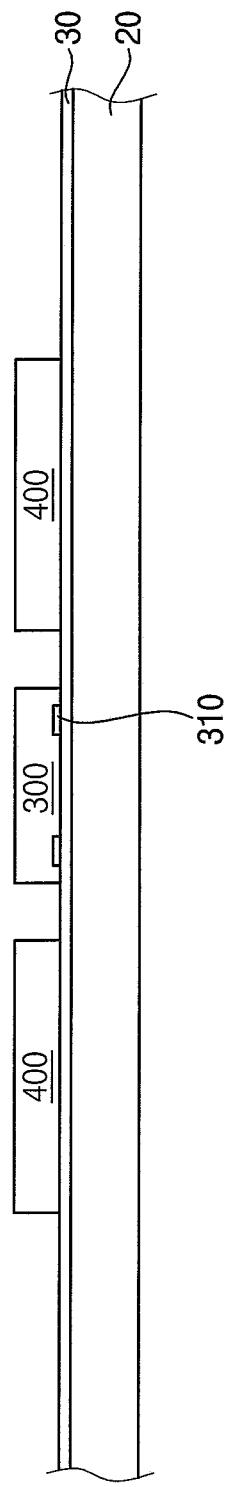
FIGS. 5 to 15 are cross-sectional views illustrating stages in a method of manufacturing a semiconductor package in accordance with example embodiments.

Referring to FIG. 5, after a separation layer 30 is formed on a carrier substrate 20, the semiconductor chip 300 and the plurality of spacer chips 400 may be arranged on the carrier substrate 20.

In example embodiments, the carrier substrate 20 may be used as a base substrate on which the semiconductor chip 300 and the spacer chips 400 are arranged, and a mold substrate is to be formed to encapsulate the semiconductor chip 300 and the spacer chips 400. The carrier substrate 20 may have a shape corresponding to a wafer on which a semiconductor fabrication process is performed. Alternatively, the carrier substrate 20 may have a shape corresponding to a panel carrier according to the number of the semiconductor chips arranged thereon. The carrier substrate 20 may include, e.g., a silicon substrate, a glass substrate, or a non-metal or metal plate.

The separation layer 30 may include a polymer tape acting as a temporary adhesive. The separation layer 30 may include a material capable of losing adhesive strength when it is subjected to light or heat. For example, the separation layer 30 may include an adhesive member such as thermal release tape. Alternatively, the separation layer 30 may include, e.g., dual curing silicone adhesive capable of crosslinking upon exposure to visible light or ultraviolet radiation.

In example embodiments, the semiconductor chip 300 may include the plurality of chip pads 310 on the first surface (e.g., active surface) thereof. The semiconductor chip 300 may be disposed on the carrier substrate 20 such that the first surface on which the chip pads 310 are formed faces toward the carrier substrate 20.

The semiconductor chip 300 and the plurality of the spacer chips 400 may be arranged to be spaced apart from each other. The spacer chips 400 may be arranged symmetrically on both sides of the semiconductor chip 300.

The semiconductor chip 300 may include integrated circuits. For example, the semiconductor chip 300 may be a logic chip including logic circuits. The logic chip may be a controller for controlling memory chips. The semiconductor chip 300 may be a processor chip such as ASIC for host, e.g., CPU, GPU, SoC, etc.

The spacer chip 400 may include a dummy semiconductor chip including silicon. The number, thickness, area, arrangements, etc. of the spacer chips 400 may be modified, e.g., adjusted, in order to prevent warpage of the lower package structure 200 including the spacer chips 400, e.g., adjust the number of the spacer chips 400 to be arranged symmetrically around the semiconductor chip 300 to prevent warpage.

Figure 6:
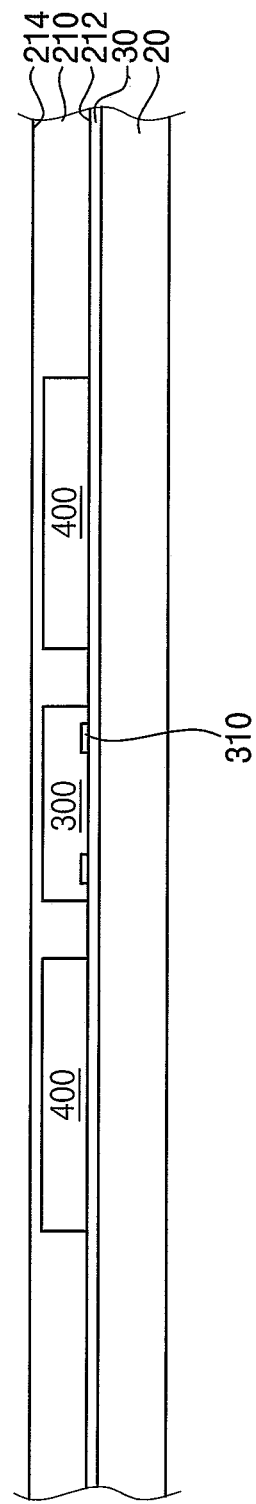

Referring to FIG. 6, the mold substrate 210 may be formed on the carrier substrate 20 to cover the semiconductor chip 300 and the spacer chips 400.

In example embodiments, the mold substrate 210 covering the semiconductor chip 300 and the spacer chips 400 may be formed by forming a molding material on the separation layer 30 by an encapsulation process. The mold substrate 210 may include, e.g., an epoxy molding compound.

The mold substrate 210 may be formed to completely cover the semiconductor chip 300 and the spacer chips 400. Thus, the first surface of the semiconductor chip 300 may be exposed by the mold substrate 210, and a second surface opposite to the first surface of the semiconductor chip 300 and side surfaces thereof may be covered by the mold substrate 210. Similarly, surfaces other than one surface of the spacer chip 400 may be covered by the mold substrate 210. Additionally, the mold substrate 210 may fill spaces between the semiconductor chip 300 and the spacer chips 400.

Figure 7:
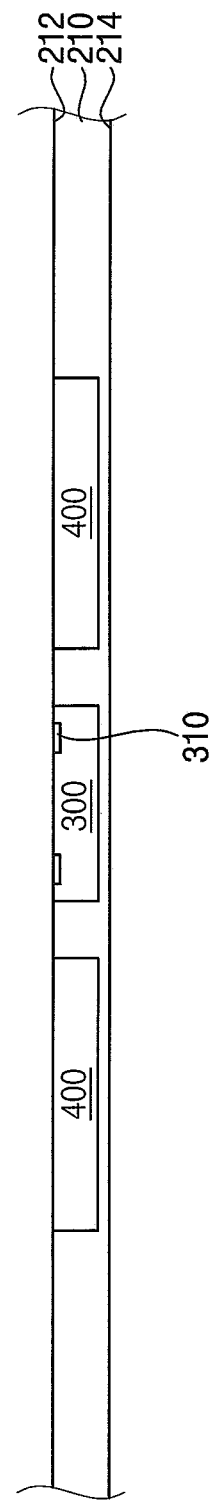

Referring to FIG. 7, the structure including the mold substrate 210 formed therein in FIG. 6 may be reversed. Then, the carrier substrate 20 and the separation layer 30 may be removed from the mold substrate 210.

In example embodiments, the separation layer 30 may be heated to remove the carrier substrate 20 from the mold substrate 210. As the carrier substrate 20 is removed, the first surface of the semiconductor chip 300 may be exposed from, e.g., through, the first surface 212 of the mold substrate 210, e.g., the first surface of the semiconductor chip 300 and the first surface 212 may be substantially coplanar. Accordingly, the chip pads 310 of the semiconductor chip 300 may be exposed from, e.g., through, the first surface 212 of the mold substrate 210.

Figure 8:
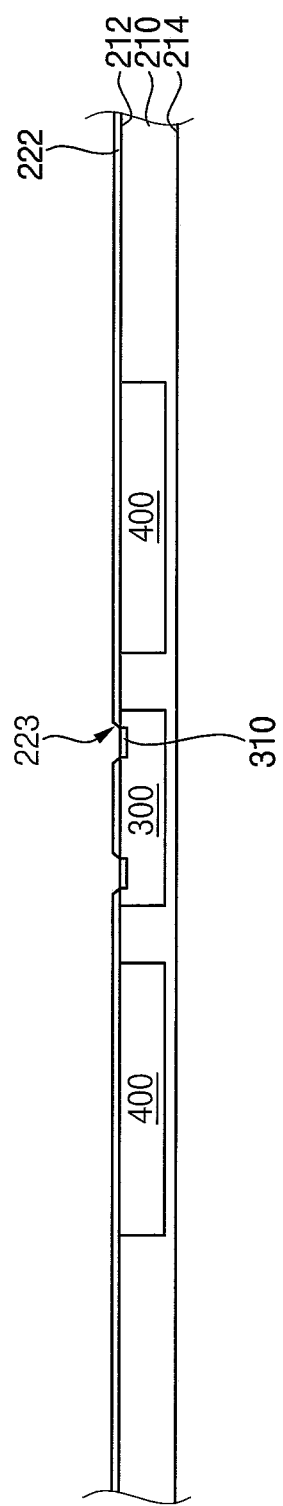
Figure 9:
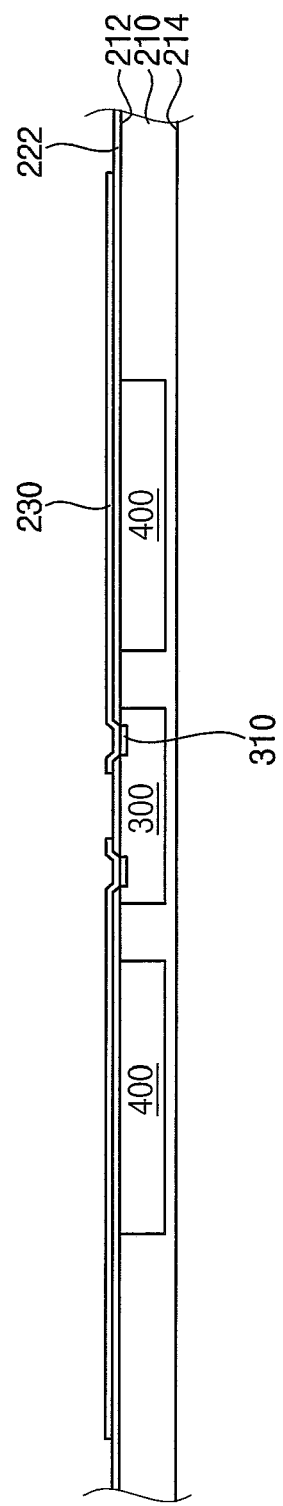
Figure 10:
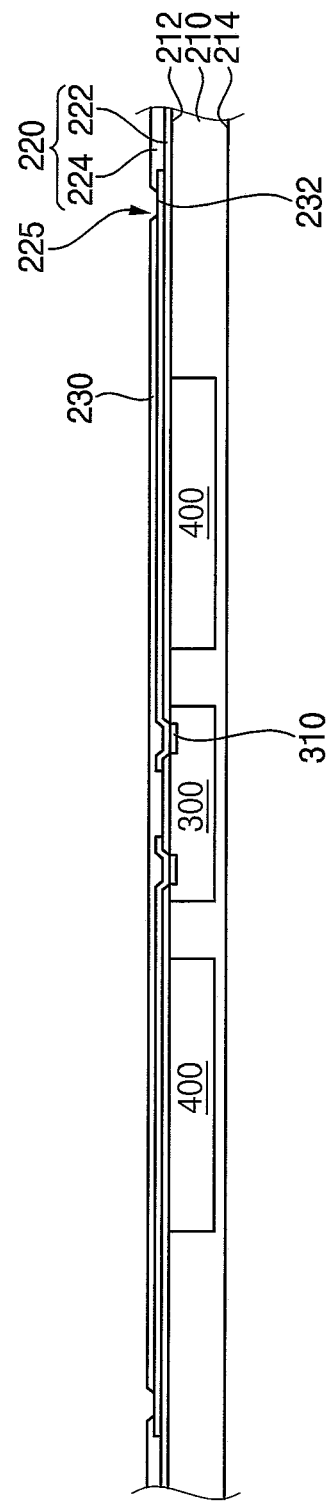

Referring to FIGS. 8 to 10, the redistribution wiring layer 220 having the redistribution wirings 230 electrically connected to the chip pads 310 may be formed on the first surface 212 of the mold substrate 210.

As illustrated in FIG. 8, the first insulation layer 222 may be formed on the first surface 212 of the mold substrate 210.

Then, the first insulation layer 222 may be patterned to form the first openings 223 that expose the chip pads 310 of the semiconductor chip 300, respectively. For example, the first insulation layer 222 may include a polymer layer, a dielectric layer, etc. The first insulation layer 222 may include a photosensitive insulating layer. The first insulation layer 222 may be formed by, e.g., a vapor deposition process, a spin coating process, etc.

As illustrated in FIG. 9, the redistribution wirings 230 may be formed on the first insulation layer 222 contact the chip pads 310 through the first openings 223, respectively. The redistribution wiring 230 may be formed to extend from the chip pad 310 of the semiconductor chip 300 to a peripheral region. As described later, a portion of the redistribution wiring 230 formed in the peripheral region may serve as a redistribution wiring pad which is to be bonded to a bonding wire.

In example embodiments, the redistribution wirings 230 may be formed on portions of the first insulation layer 222 and the chip pads 310. The redistribution wiring 230 may be formed by forming a seed layer on a portion of the first insulation layer 222 and in the first opening, patterning the seed layer, and performing an electro plating process. Accordingly, at least a portion of the redistribution wiring 230 may contact the chip pad 310 through the first opening.

For example, in order to pattern the seed layer, a photoresist layer may be formed on the seed layer, and then, an exposure process and a development process may be performed on the photoresist layer to form a first photoresist pattern for exposing a redistribution wiring region. The electroplating process may be performed to form the redistribution wirings 230 in the redistribution wiring region defined by the first photoresist pattern. The redistribution wiring 230 may include, e.g., aluminum (Al), copper (Cu), tin (Sn), nickel (Ni), gold (Au), platinum (Pt) or an alloy thereof.

Then, the first photoresist pattern may be removed by a strip process. Then, the remaining seed layer may be removed by a wet etch process.

As illustrated in FIG. 10, the second insulation layer 224 may be formed on the first insulation layer 222 to cover the redistribution wirings 230, followed by patterning the second insulation layer 224 to form the second openings 225 that expose portions of the redistribution wirings 230, i.e., the redistribution wiring pad regions.

For example, the second insulation layer 224 may include a polymer layer, a dielectric layer, etc. The second insulation layer 224 may include a photosensitive insulating layer. The second insulation layer 224 may be formed by, e.g., a vapor deposition process, a spin coating process, etc.

The portion of the redistribution wiring 230 exposed by the second opening 225 may be used as the redistribution wiring pad 232. Accordingly, the redistribution wiring layer 220 may be formed on the first surface 212 of the mold substrate 210, may include the redistribution wirings 230 electrically connected to the chip pads 310, and the redistribution wiring 230 may include the redistribution wiring pad 232 to be bonded to the bonding wire.

Figure 11:
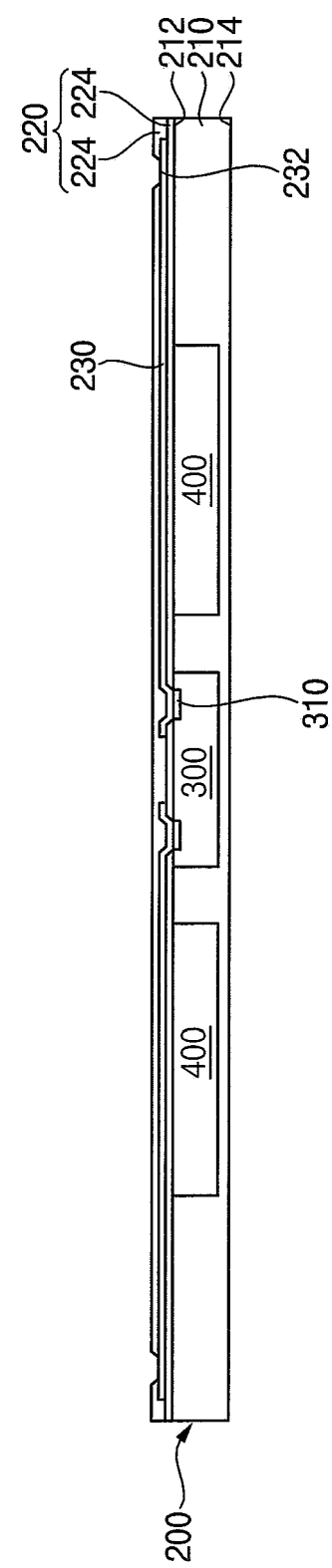

Referring to FIG. 11, the mold substrate 210 may be divided through a singulation process to form the lower package structure 200 as a fan out package. Accordingly, the lower package structure 200 may include the mold substrate 210, the semiconductor chip 300 provided in the mold substrate 210 such that the chip pads 310 are exposed from the mold substrate 210, the plurality of the spacer chips 400 provided in the mold substrate 210 to be spaced apart from the semiconductor chip 300, and the redistribution wiring layer 220 formed on the first surface 212 of the mold substrate 210 and having the redistribution wirings 230 electrically connected to the chip pads 310. The redistribution wiring 230 may include the redistribution wiring pad 232 arranged in the peripheral region of the mold substrate 210.

Additionally, because the spacer chips 400 are arranged, e.g., symmetrically, at sides of the semiconductor chip 300, and the lower surface and side surfaces of the semiconductor chip 300 are covered by the mold substrate 210, warpage of the lower package structure 200 of the fan out package may be reduced or prevented.

Figure 12:
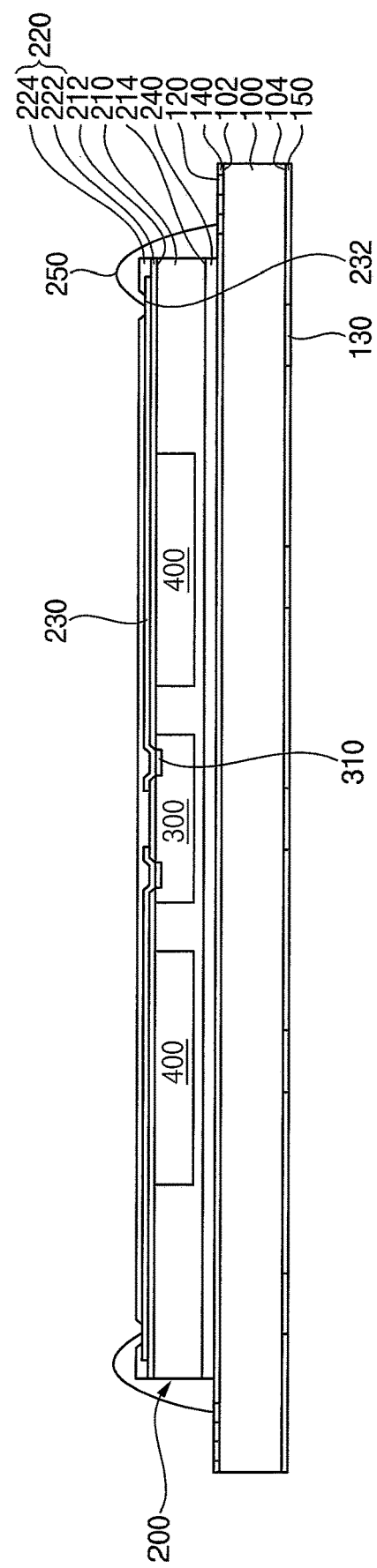

Referring to FIG. 12, the lower package structure 200 may be stacked on the package substrate 100.

In example embodiments, the package substrate 100 may be a substrate having the upper surface 102 and the lower surface 104 opposite to each other. For example, the package substrate 100 may include a printed circuit board (PCB), a flexible substrate, a tape substrate, etc. The package substrate 100 may be a multi circuit board having vias and various circuit elements therein. The package substrate 100 may include wirings as channels for electrical connection between the semiconductor chip 300 and memory chips as described later.

The substrate pads 120 may be arranged on the upper surface 102 of the package substrate 100. The substrate pads 120 may be connected to the wirings, respectively. The wirings may extend on the upper surface 102 of the package substrate 100 or inside the package substrate 100. For example, at least a portion of the wiring may be used as the substrate pad, i.e., a landing pad.

The lower package structure 200 may be adhered onto the upper surface 102 of the package substrate 100 by an adhesive member 240. For example, the adhesive member may include an adhesive film, e.g., a direct adhesive film (DAF).

Then, the semiconductor chip 300 may be electrically connected to the package substrate 100 by first conductive connection members 250.

A wire bonding process may be performed to electrically connect chip pads 310 of the semiconductor chip 300 to the substrate pads 120 on the upper surface 102 of the package substrate 100 by the first conductive connection members 250. The redistribution wiring pads 232 of the lower package structure 200 may be electrically connected to the substrate pads 120 by the first conductive connection members 250. For example, the first conductive connection member 250 may include a bonding wire.

Figure 13:
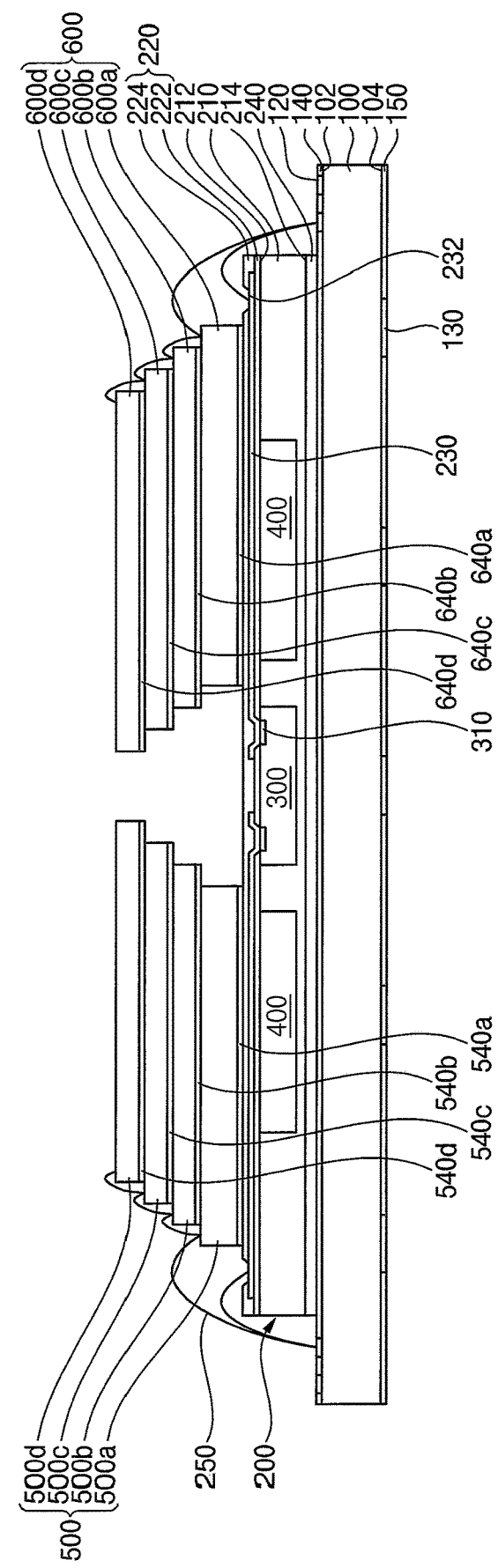
Figure 14:
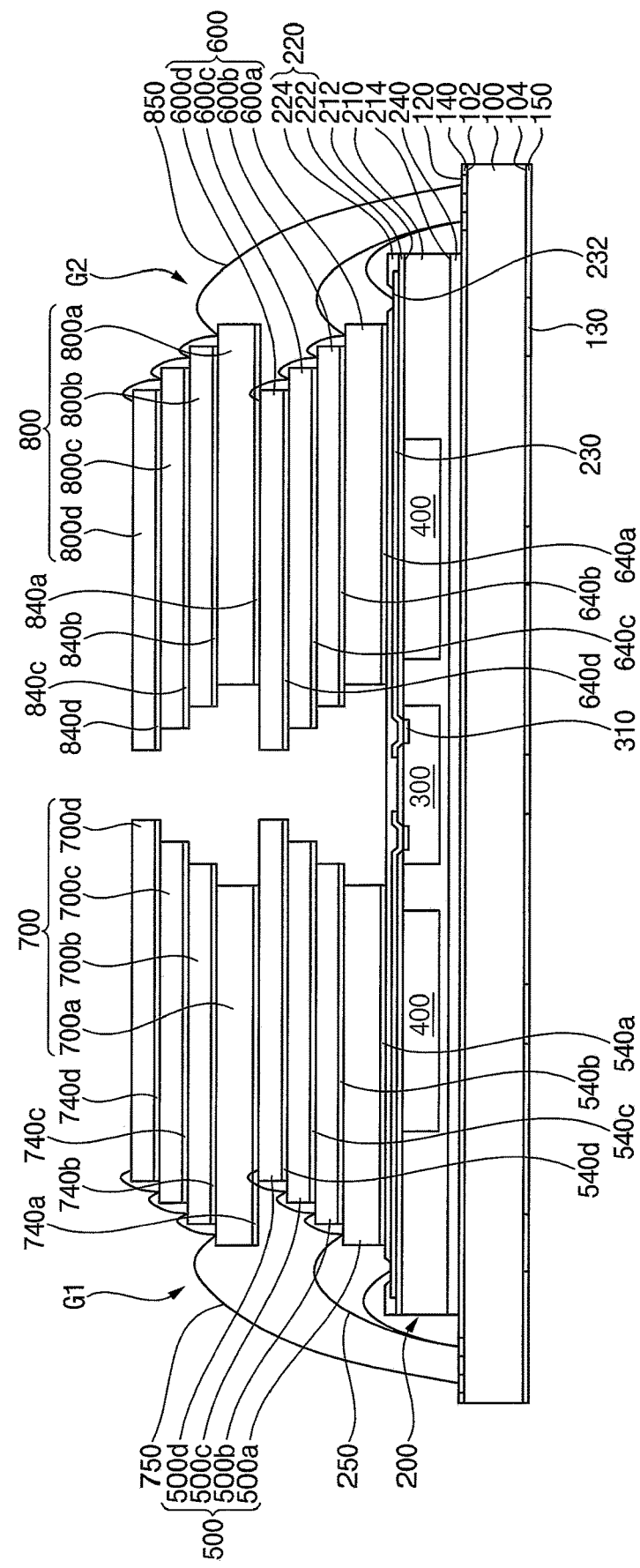

Referring to FIGS. 13 and 14, the first stack structure G1 and the second stack structure G2 may be stacked on the lower package structure 200 on the package substrate 100. The first stack structure G1 and the second stack structure G2 may be stacked on the lower package structure 200 to be spaced apart from each other.

As illustrated in FIG. 13, in example embodiments, a die attach process may be performed to stack the plurality of first memory chips 500 on the lower package structure 200. The first stack structure G1 may include the same type of the first memory chips 500a, 500b, 500c, 500d. The first memory chips 500a, 500b, 500c, 500d may be sequentially adhered on the lower package structure 200 using second adhesive members 540a, 540b, 540c, 540d. For example, the memory chip may include a memory device, e.g., DRAM, NAND flash memory, etc. The second adhesive member may include an adhesive film, e.g., a direct adhesive film (DAF).

A thickness of the lowermost first memory chip 500a of the first memory chips 500 may be greater than a thickness of other first memory chip 500b, 500c, 500d, e.g., along a direction normal to the upper surface of the package substrate 100. Because the lowermost first memory chip 500a has a relatively greater thickness, cracks may be prevented from occurring in the lowermost first memory chip 500a.

Then, the first memory chips 500 of the first stack structure G1 may be electrically connected to the package substrate 100 by the second conductive connection members 550.

A wire bonding process may be performed to electrically connect chip pads of the first memory chips 500a, 500b, 500c, 500d to the substrate pads 120 on the upper surface 102 of the package substrate 100 by the second conductive connection members 550. The chip pads of the first memory chips 500a, 500b, 500c, 500d may be electrically connected to the substrate pads 120 by the second conductive connection members 550. For example, the second conductive connection member 550 may include a bonding wire.

Then, a die attach process may be performed to stack a plurality of second memory chips 600 on the lower package structure 200. The second stack structure G2 may include the same type of the second memory chips 600a, 600b, 600c, 600d. The second memory chips 600a, 600b, 600c, 600d may be sequentially adhered on the lower package structure 200 using second adhesive members 640a, 640b, 640c, 640d. For example, the memory chip may include a memory device, e.g., DRAM, NAND flash memory, etc. The second adhesive member may include an adhesive film, e.g., a direct adhesive film (DAF).

A thickness of the lowermost second memory chip 600a of the second memory chips 600 may be greater than a thickness of other second memory chip 600b, 600c, 600d. Because the lowermost second memory chip 600a has a relatively greater thickness, cracks may be prevented from occurring in the lowermost second memory chip 600a.

Then, the second memory chips 600 of the second stack structure G2 may be electrically connected to the package substrate 100 by the second conductive connection members 650.

A wire bonding process may be performed to electrically connect chip pads of the second memory chips 600a, 600b, 600c, 600d to the substrate pads 120 on the upper surface 102 of the package substrate 100 by the second conductive connection members 650. The chip pads of the second memory chips 600a, 600b, 600c, 600d may be electrically connected to the substrate pads 120 by the second conductive connection members 650. For example, the second conductive connection member 650 may include a bonding wire.

In example embodiments, the first memory chips 500a, 500b, 500c, 500d may be stacked in a cascade structure. The second memory chips 600a, 600b, 600c, 600d may be stacked in a cascade structure. The first memory chips 500a, 500b, 500c, 500d may be sequentially offset-aligned in a direction toward the second stack structure G2 on the lower package structure 200. The second memory chips 600a, 600b, 600c, 600d may be sequentially offset-aligned in a direction toward the first stack structure G1 on the lower package structure 200.

As illustrated in FIG. 14, in example embodiments, a die attach process may be performed to stack a plurality of third memory chips 700 on the lower package structure 200. The first stack structure G1 may include the same type of the third memory chips 700a, 700b, 700c, 700d. The third memory chips 700a, 700b, 700c, 700d may be sequentially adhered on the first memory chips 600 on the lower package structure 200 using second adhesive members 740a, 740b, 740c, 740d. For example, the memory chip may include a memory device, e.g., DRAM, NAND flash memory, etc. The second adhesive member may include an adhesive film, e.g., a direct adhesive film (DAF).

Then, the third memory chips 700 of the first stack structure G1 may be electrically connected to the package substrate 100 by the second conductive connection members 750.

A wire bonding process may be performed to electrically connect chip pads of the third memory chips 700a, 700b, 700c, 700d to the substrate pads 120 on the upper surface 102 of the package substrate 100 by the second conductive connection members 750. The chip pads of the third memory chips 700a, 700b, 700c, 700d may be electrically connected to the substrate pads 120 by the second conductive connection members 750. For example, the second conductive connection member 750 may include a bonding wire.

Then, a die attach process may be performed to stack a plurality of fourth memory chips 800 on the lower package structure 200. The second stack structure G2 may include the same type of the fourth memory chips 800a, 800b, 800c, 800d. The fourth memory chips 800a, 800b, 800c, 800d may be sequentially adhered on the lower package structure 200 using second adhesive members 840a, 840b, 840c, 840d. For example, the memory chip may include a memory device, e.g., DRAM, NAND flash memory, etc. The second adhesive member may include an adhesive film, e.g., a direct adhesive film (DAF).

Then, the fourth memory chips 800 of the second stack structure G2 may be electrically connected to the package substrate 100 by the second conductive connection members 850.

A wire bonding process may be performed to electrically connect chip pads of the fourth memory chips 800a, 800b, 800c, 800d to the substrate pads 120 on the upper surface 102 of the package substrate 100 by the second conductive connection members 850. The chip pads of the fourth memory chips 800a, 800b, 800c, 800d may be electrically connected to the substrate pads 120 by the second conductive connection members 850. For example, the second conductive connection member 850 may include a bonding wire.

In example embodiments, the third memory chips 700a, 700b, 700c, 700d may be stacked in a cascade structure. The fourth memory chips 800a, 800b, 800c, 800d may be stacked in a cascade structure. The third memory chips 700a, 700b, 700c, 700d may be sequentially offset-aligned in a direction toward the second stack structure G2 on the lower package structure 200. The fourth memory chips 800a, 800b, 800c, 800d may be sequentially offset-aligned in a direction toward the first stack structure G1 on the lower package structure 200.

Figure 15:
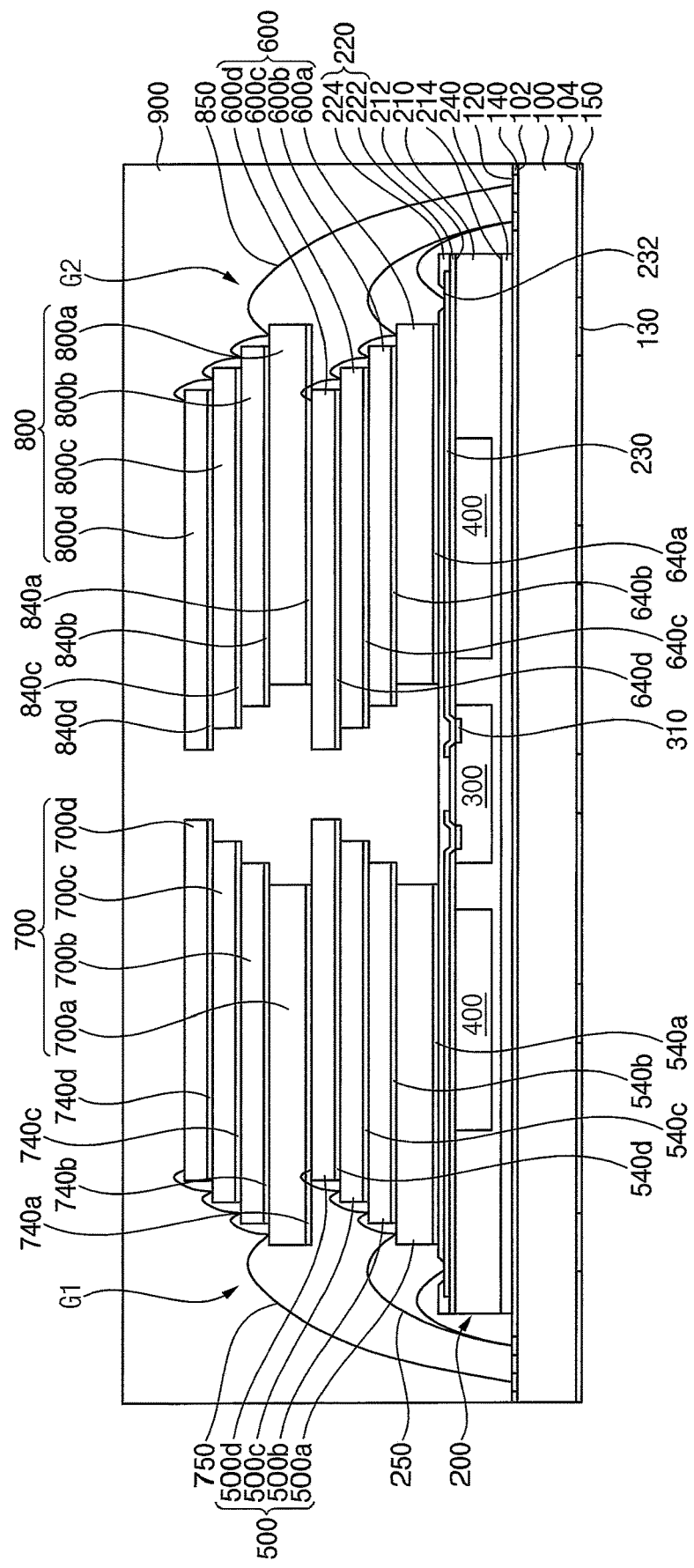

Referring to FIG. 15, the molding member 900 may be formed on the upper surface 102 of the package substrate 100 to cover the lower package structure 200 and the first and second stack structures G1 and G2. The molding member may include, e.g., epoxy molding compound (EMC).

Then, the outer connection members (160, see FIG. 1) may be formed on the outer connection pads 130 on the lower surface 104 of the package substrate 100, to complete a semiconductor package 10 in FIG. 1.

Figure 16:
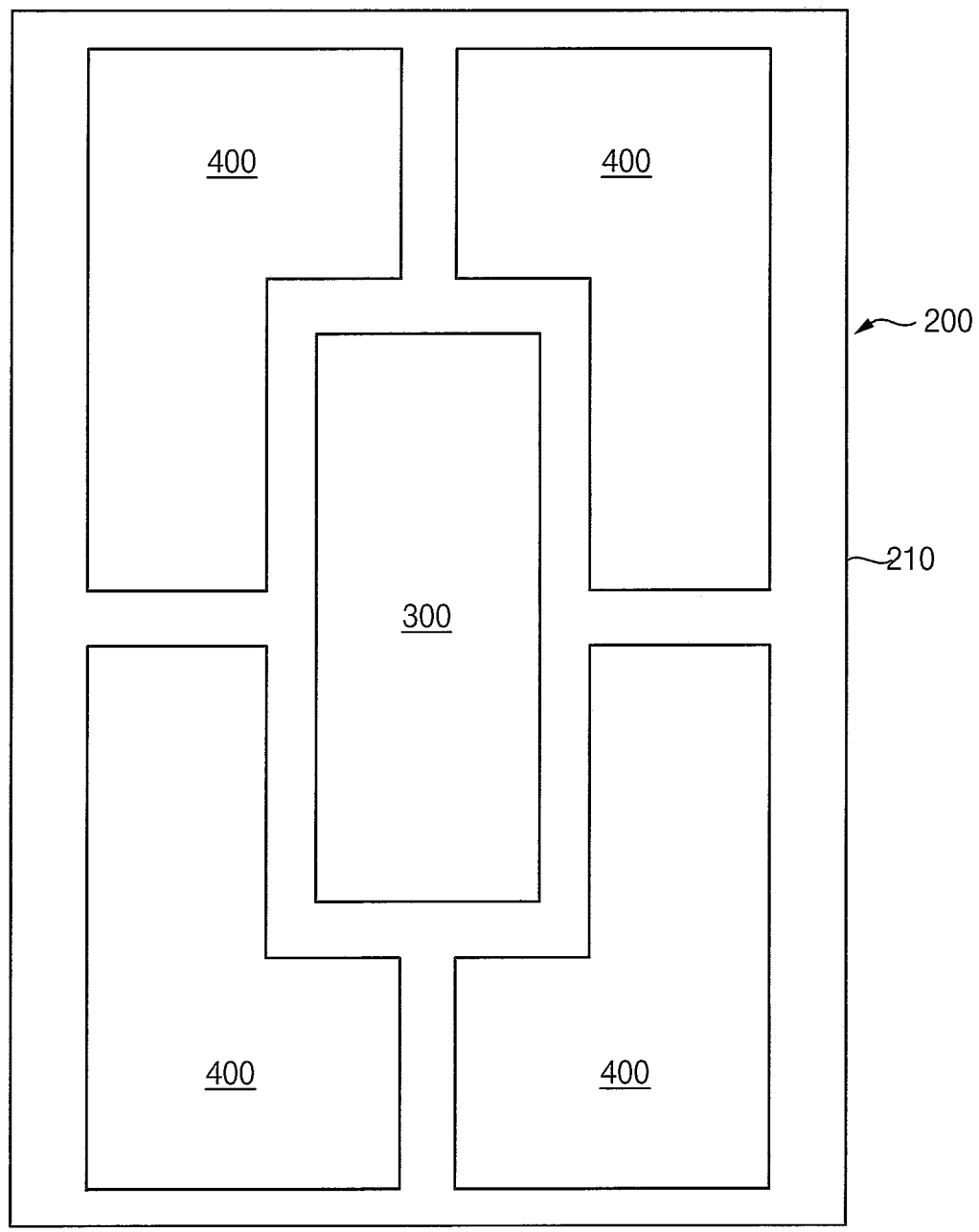
FIG. 16 is a plan view illustrating a semiconductor package in accordance with example embodiments.

FIG. 16 is a plan view illustrating a semiconductor package in accordance with example embodiments. The semiconductor package may be substantially the same as or similar to the semiconductor package described with reference to FIG. 1, except for an arrangement of spacer chips in a lower package structure. Thus, same reference numerals will be used to refer to the same or like elements and any further repetitive explanation concerning the above elements will be omitted.

Referring to FIG. 16, the semiconductor chip 300 may be arranged in a middle region of the mold substrate 210, and spacer chips 400 may be arranged symmetrically around the semiconductor chip 300. The spacer chips 400 may be arranged in correspondence to corner portions of the semiconductor chip 300. The spacer chip 400 may extend around a circumference of the corner portion of the semiconductor chip 300. The spacer chips 400 may be arranged to surround the semiconductor chip 300, as viewed in a top view. The spacer chips 400 may be arranged to prevent warpage of the lower package structure 200 and more firmly support a plurality of memory chips stacked on the lower package structure 200.

The semiconductor package 10 may include semiconductor devices, e.g., logic devices or memory devices. The semiconductor package 10 may include logic devices, e.g., central processing units (CPUs), main processing units (MPUs), or application processors (APs), or the like, and volatile memory devices, e.g., DRAM devices, high bandwidth memory (HBM) devices, or non-volatile memory devices such as flash memory devices, phase change random-access memory (PRAM) devices, magnetoresistive random-access memory (MRAM) devices, resistive random-access memory (ReRAM) devices, or the like.

By way of summation and review, since a conventional UFS package includes a dummy chip having a dolmen structure for an internal controller chip, the overall package thickness may increase and its mechanical reliability may be deteriorated. In contrast, example embodiments provide a semiconductor package including a controller-spacer package structure capable of decreasing a total package thickness and preventing warpage. Example embodiments also provide a method of manufacturing the semiconductor package.

That is, according to example embodiments, a semiconductor package may include a lower package structure as a fan-out package including a semiconductor chip and a plurality of spacer chips provided in a mold substrate, and first and second stack structures arranged on the lower package structure to be spaced apart from each other and each including a plurality of the memory chips. A first surface (active surface) of the semiconductor chip and upper surfaces of the spacer chips may be provided to be exposed from the mold substrate, to thereby decrease the entire thickness of the package. The spacer chips may be molded in the lower package structure to be arranged symmetrically in both sides of the semiconductor chip to thereby reduce or prevent warpage of the lower package structure.

Additionally, because a lower surface (backside) of the semiconductor chip and lower surfaces of the spacer chips are covered by the mold substrate, an adhesive strength of an adhesive member that adheres the mold substrate onto a package substrate may be increased. Further, as the lower surface of the semiconductor chip is covered by the mold substrate, the semiconductor chip may be protected from external impacts and ionic impurities may be prevented from penetrating into the semiconductor chip through the adhesive member.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a package substrate;
   a lower package structure on the package substrate, the lower package structure including:
      a mold substrate,
      a semiconductor chip in the mold substrate, chip pads of the semiconductor chip being exposed through the mold substrate,
      spacer chips in the mold substrate, the spacer chips being spaced apart from the semiconductor chip, and
      a redistribution wiring layer on the mold substrate, the redistribution wiring layer having redistribution wirings electrically connected to the chip pads of the semiconductor chip;
   first and second stack structures on the lower package structure, the first and second stack structures being spaced apart from each other, and each of the first and second stack structures including stacked memory chips; and
   a molding member on the package substrate, the molding member covering the lower package structure and the first and second stack structures,
   wherein the mold substrate includes a first covering portion and a second covering portion, the first covering portion covering side surfaces of the semiconductor chip and the spacer chips, and the second covering portion covering a lower surface of the semiconductor chip.

2. The semiconductor package as claimed in claim 1, wherein the mold substrate further includes a third covering portion covering lower surfaces of the spacer chips.

3. The semiconductor package as claimed in claim 1, further comprising a first adhesive member adhering the mold substrate of the lower package structure onto the package substrate.

4. The semiconductor package as claimed in claim 3, wherein a thickness of the semiconductor chip is within a range of 40 μm to 60 μm, and a thickness of the first adhesive member is within a range of 15 μm to 25 μm.

5. The semiconductor package as claimed in claim 1, wherein a lowermost of the stacked memory chips in each of the first and second stack structures is adhered onto the lower package structure by a second adhesive member, a height of the lowermost of the stacked memory chips from an upper surface of the package substrate is within a range of 110 μm to 130 μm.

6. The semiconductor package as claimed in claim 1, wherein a ratio of a width of a lowermost of the stacked memory chips in each of the first and second stack structures and a width of the lower package structure is less than 0.5.

7. The semiconductor package as claimed in claim 1, wherein a number of the stacked memory chips in the first stack structure equals a number of the stacked memory chips in the second stack structure.

8. The semiconductor package as claimed in claim 1, further comprising first conductive connection members electrically connecting redistribution wiring pads of the redistribution wiring layer and substrate pads of the package substrate, the redistribution wiring pads being electrically connected to the chip pads of the semiconductor chip.

9. The semiconductor package as claimed in claim 8, wherein the first conductive connection members include bonding wires.

10. The semiconductor package as claimed in claim 1, further comprising second conductive connection members electrically connecting connection pads of the stacked memory chips in each of the first and second stack structures and substrate pads of the package substrate.

11. A semiconductor package, comprising:
a package substrate;
a first adhesive member on the package substrate, a thickness of the first adhesive member being within a range of 15 µm to 25 µm,
a lower package structure on the package substrate, the first adhesive member being directly between the lower package structure and the package substrate, and the lower package structure including:
 a mold substrate,
 a semiconductor chip in the mold substrate, chip pads of the semiconductor chip being exposed through the mold substrate, and a thickness of the semiconductor chip being within a range of 40 µm to 60 µm,
 spacer chips in the mold substrate, the spacer chips being spaced apart from the semiconductor chip, and
 a redistribution wiring layer on the mold substrate and having redistribution wirings electrically connected to the chip pads of the semiconductor chip;
first and second stack structures on the lower package structure, the first and second stack structures being spaced apart from each other, and each of the first and second stack structures including stacked memory chips; and
a molding member on the package substrate, the molding member covering the lower package structure and the first and second stack structures.

12. The semiconductor package as claimed in claim 11, wherein a lowermost of the stacked memory chips in each of the first and second stack structures is adhered onto the lower package structure by a second adhesive member, a height of the lowermost of the stacked memory chips from an upper surface of the package substrate is within a range of 110 µm to 130 µm.

13. The semiconductor package as claimed in claim 11, wherein a ratio of a width of a lowermost of the stacked memory chips in each of the first and second stack structures and a width of the lower package structure is less than 0.5.

14. The semiconductor package as claimed in claim 11, wherein the mold substrate includes:
a first covering portion covering side surfaces of the semiconductor chip and the spacer chips;
a second covering portion covering a lower surface of the semiconductor chip; and
a third covering portion covering lower surfaces of the spacer chips.

15. The semiconductor package as claimed in claim 11, wherein a number of the stacked memory chips in the first stack structure equals a number of the stacked memory chips in the second stack structure.

16. The semiconductor package as claimed in claim 11, wherein the redistribution wiring layer includes redistribution wiring pads electrically connected to the chip pads of the semiconductor chip.

17. The semiconductor package as claimed in claim 16, wherein the redistribution wiring pads are in a peripheral region that does not overlap with the stacked memory chips of the first and second stack structures.

18. The semiconductor package as claimed in claim 16, further comprising first conductive connection members electrically connecting the redistribution wiring pads and substrate pads of the package substrate.

19. The semiconductor package as claimed in claim 18, wherein the first conductive connection members include bonding wires.

20. A semiconductor package, comprising:
a package substrate;
a lower package structure on the package substrate, the lower package structure including:
 a mold substrate,
 a semiconductor chip in the mold substrate, chip pads of the semiconductor chip being exposed through the mold substrate,
 spacer chips in the mold substrate, the spacer chips being spaced apart from the semiconductor chip, and
 a redistribution wiring layer on the mold substrate and having redistribution wiring pads electrically connected to the chip pads of the semiconductor chip;
first and second stack structures on the lower package structure, the first and second stack structures being spaced apart from each other, and each of the first and second stack structures including stacked memory chips;
first conductive connection members electrically connecting the redistribution wiring pads and substrate pads of the package substrate;
second conductive connection members electrically connecting connection pads of the stacked memory chips in the first and second stack structures and the substrate pads of the package substrate; and
a molding member on the package substrate that covers the lower package structure and the first and second stack structures,
wherein the mold substrate includes a first covering portion covering side surfaces of the semiconductor chip and the spacer chips, and a second covering portion covering a lower surface of the semiconductor chip.

* * * * *